(12) United States Patent
Tseng et al.

(10) Patent No.: US 6,657,865 B1
(45) Date of Patent: Dec. 2, 2003

(54) HEAT DISSIPATING STRUCTURE

(75) Inventors: Wen Hai Tseng, Sanchung (TW); Cheng Tu Wang, Sanchung (TW); Jian Chian Kang, Sanchung (TW)

(73) Assignee: Wuh Chuong Indutrial Co., Ltd., Taipei Hsien (TW)

( * ) Notice: Subject to any disclaimer, the term of this patent is extended or adjusted under 35 U.S.C. 154(b) by 0 days.

(21) Appl. No.: 10/316,841

(22) Filed: Dec. 12, 2002

(51) Int. Cl.[7] .................................................. H05K 7/20
(52) U.S. Cl. ...................... 361/709; 361/704; 361/710; 165/80.3; 257/722; 174/16.3
(58) Field of Search ................................ 361/694, 695, 361/697, 704, 709, 710; 257/722, 706; 174/16.3; 165/80.3, 185

(56) References Cited

U.S. PATENT DOCUMENTS

| | | | | |
|---|---|---|---|---|
| 5,558,155 A | * | 9/1996 | Ito ............................. | 165/80.3 |
| 6,104,609 A | * | 8/2000 | Chen .......................... | 361/695 |
| 6,176,304 B1 | * | 1/2001 | Lee ............................ | 165/185 |
| 6,269,003 B1 | * | 7/2001 | Wen-Chen .................. | 361/704 |
| 6,336,498 B1 | * | 1/2002 | Wei ............................ | 165/80.3 |
| 6,373,699 B1 | * | 4/2002 | Chen .......................... | 361/697 |
| 6,382,307 B1 | * | 5/2002 | Wang et al. ................ | 165/80.3 |
| 6,396,697 B1 | * | 5/2002 | Chen .......................... | 361/704 |
| 6,449,160 B1 | * | 9/2002 | Tsai ........................... | 361/709 |

\* cited by examiner

*Primary Examiner*—Boris Chérvinsky
(74) *Attorney, Agent, or Firm*—Browdy and Neimark

(57) ABSTRACT

A heat dissipating structure is formed via the assembly of metallic fins. An upper side, an inner side, and a lower side of each fin respectively form a first, second, and third folded edge. At least each first folded edge includes a groove through one rim and a hooking projection on an opposite rim. The metallic fins thereby assemble with one another by engagement of the hooking projection of one fin with the groove of one neighboring fin. Below the first folded edge, each fin further forms an inclined edge. The second folded edges of the fins are further in contact with a highly thermal conductive body. With the metallic fins being assembled with one another, a plurality of gaps are constituted between their inclined edges. Via a fan, the air circulation through the gaps is thereby promoted to rapidly dissipate the heat and prevent the hothouse effect.

7 Claims, 5 Drawing Sheets

HEAT DISSIPATING STRUCTURE

BACKGROUND OF THE INVENTION

1. Field of the Invention

The invention relates to a heat dissipating structure. More particularly, the invention provides a heat dissipating structure that is capable of rapidly dissipating the heat produced from an electronic device to keep the electronic device under proper temperature conditions of operation.

2. Description of the Related Art

A consequence of a faster processing speed of current electronic devices is that the amount of heat produced is much greater. To dissipate the heat from the electronic devices, the mount of a heat dissipating structure with increased heat dissipating surface areas is conventionally known in the art. The requirement for the heat dissipating structure is to effectively and rapidly dissipate the produced heat in order to keep the electronic devices under normal operating temperature conditions of operation.

FIG. 1 is a perspective view schematically illustrating a heat dissipating structure known in the prior art. The illustrated heat dissipating structure 10 of the prior art includes a plurality of fins 101, and is usually formed either by aluminum extrusion, by pressing, or by folding. Due to the constraints of the above mechanical processes, the fabricated heat dissipating structure usually does not have desired density, spacing gaps 111, and thickness with respect to the fins 101. If the amount of heat produced by the heat source 11 (such as a central processor) increases, the size of the fins 101 has to be accordingly increased, which does not provide optimal heat dissipation effects.

To promote the heat dissipation, a fan (not shown) is usually mounted on the top of the heat dissipating structure 10. But this mount has limited results. One reason is that the size of the fins has to be relatively large to have a sufficient heat dissipating surface area, which is detrimental to a rapid air circulation through the sides of the gaps 111 to dissipate heat. As a result, the. heat substantially remains in the central region of the heat dissipating structure 10, which produces an undesirably hothouse effect.

SUMMARY OF THE INVENTION

It is therefore a principal object of the invention to provide a heat dissipating structure that can efficiently dissipate the heat from an electronic device in order to prevent damageable hothouse effects.

To accomplish the above and other objectives, a heat dissipating structure of the invention is formed via the assembly with one another of a plurality of metallic fins. An upper side and an inner side of each metallic fin respectively form a first and second folded edge. At least each first folded edge, at a central region, includes a groove through one rim and a hooking projection on an opposite rim. The metallic fins thereby assemble with one another by engagement of the hooking projection of one metallic fin with the groove of one neighboring metallic fin. Below the first folded edge, each metallic fin further forms an inclined edge. The second folded edges of the metallic fins are further in contact with a highly thermal conductive body such as a copper tube. A lower side of each metallic fin further forms a third folded edge that is attached on a heat dissipating base. When the metallic fins are assembled with one another, a plurality of gaps are thereby constituted between the respective inclined edges of the metallic fins. With the help of a fan, the air circulation through the formed gaps is thereby promoted to rapidly dissipate the heat and prevent the hothouse effect.

To provide a further understanding of the invention, the following detailed description illustrates embodiments and examples of the invention that are provided for explaining the invention and should not be construed to limit the scope of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
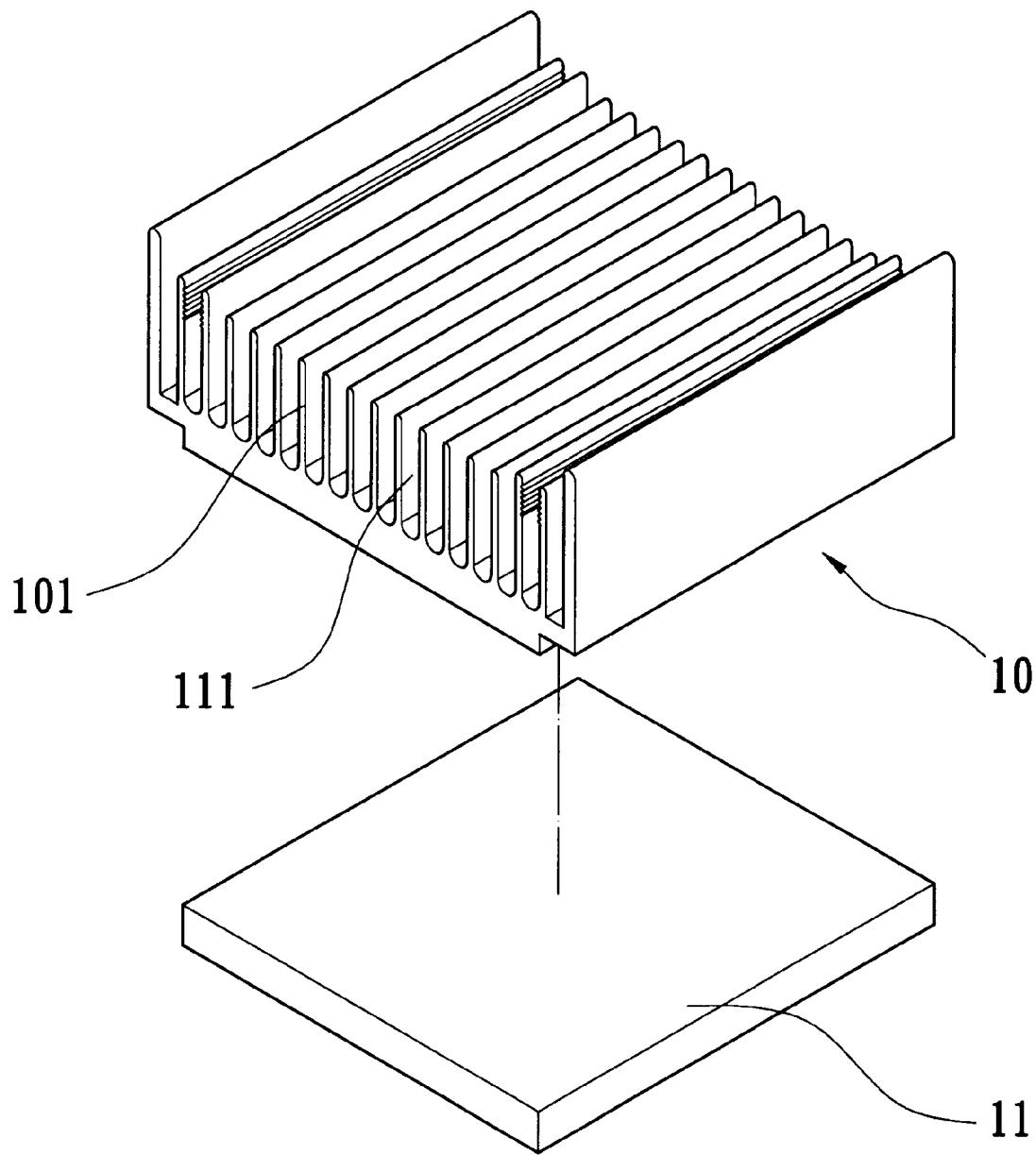
FIG. 1 is a perspective view of a heat dissipating structure known in the prior art.

Wherever possible in the following description, like reference numerals will refer to like elements and parts unless otherwise illustrated.

Referring to FIG. 2 through FIG. 5, the invention provides a heat dissipating structure that, mounted on an electronic device inside an electronic appliance such as a computer, is capable of effectively and rapidly dissipating the heat produced in operation.

Figure 2:
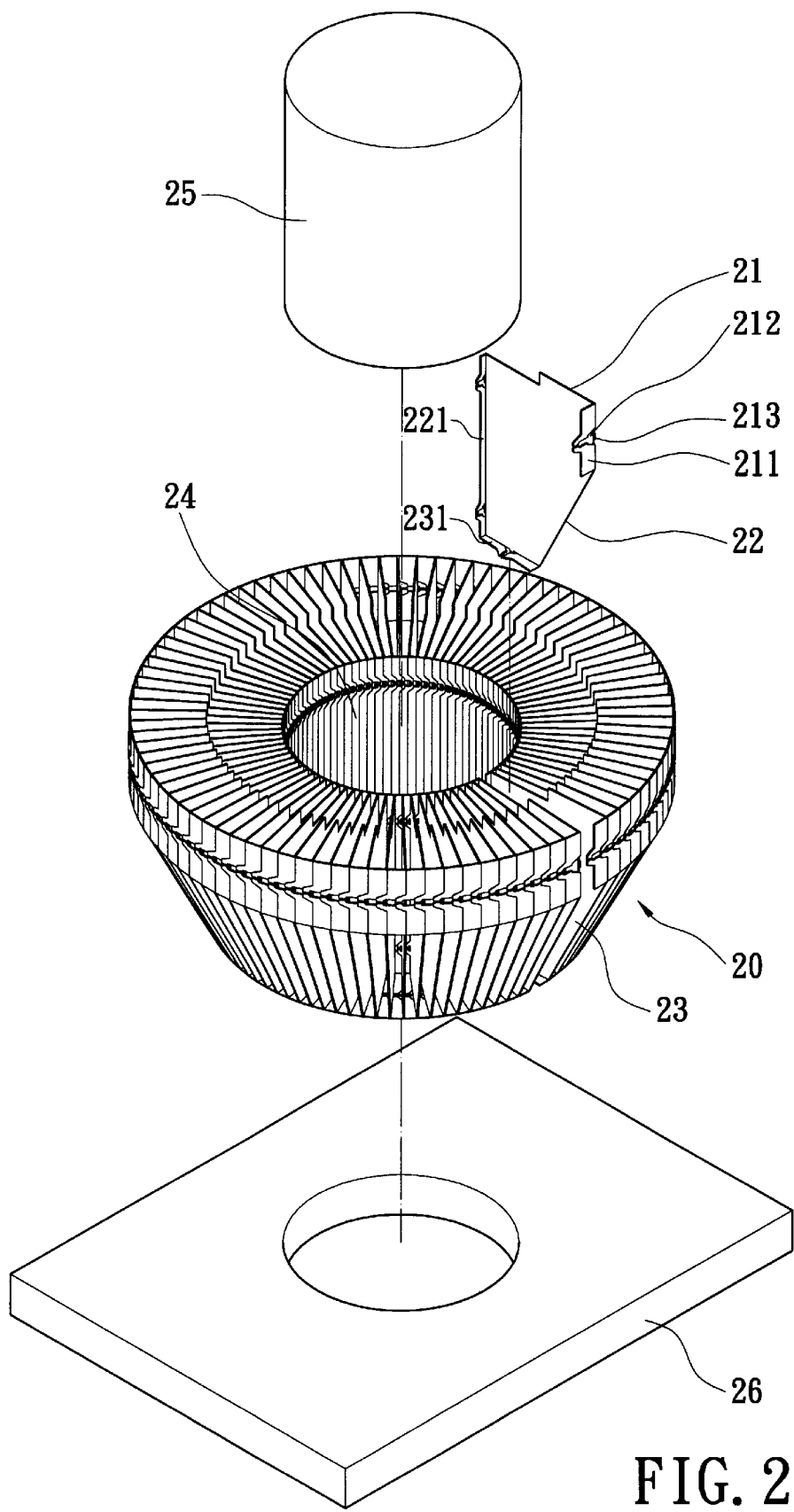
FIG. 2 is an exploded view of a heat dissipating structure according to an embodiment of the invention.
Figure 3:
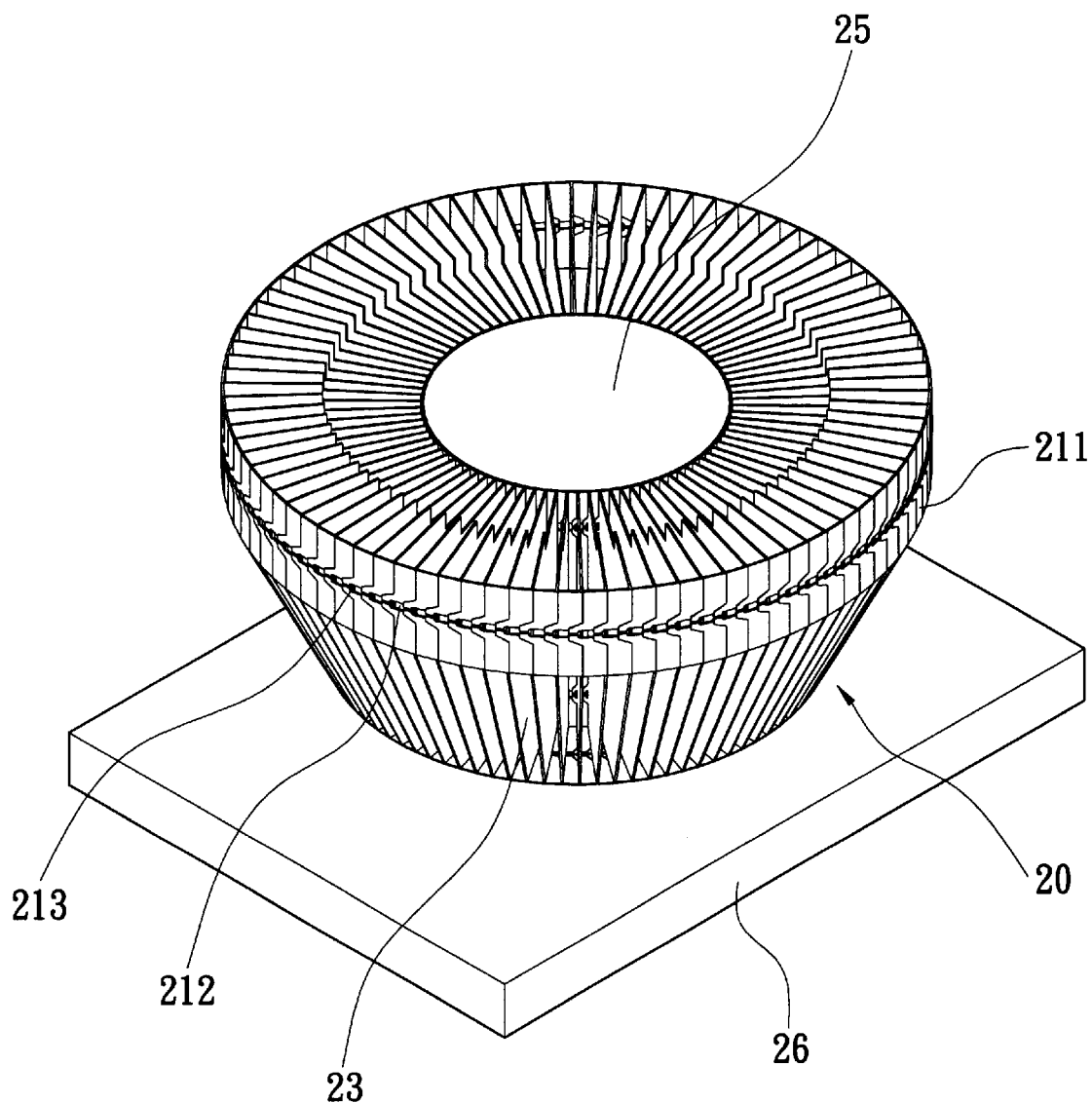
FIG. 3 is a perspective view of an assembled heat dissipating structure according to an embodiment of the invention; and, FIG. 4 and FIG. 5 are schematic side views illustrating the operation of the heat dissipating structure according to an embodiment of the invention.

A heat dissipating structure 20 of the invention comprises a plurality of metallic fins 21 made of a metal having good thermal conduction properties. The fins 21 are assembled with one another adjacent to one another according to, for example, a revolutionary arrangement (as illustrated in FIG. 2 and FIG. 3). Each fin 21 is formed by stamping, and has polygonal shape. An outer upward side of each fin 21 (referring to an upward side oriented outward with respect to the revolutionary arrangement) forms a first folded edge 211. An inner side of each fin 21 forms a second folded edge 221. A lower side of each fin 21 further forms a third folded edge 231.

Each of the first, second, and third folded edges 211, 221, 231, preferably at a central region, includes a groove 212 through one rim and a hooking projection 213 on an opposite rim. The fins 21 thereby assemble with one another by engagement of the hooking projection 213 of one fin 21 with the groove 212 of a neighboring fin 21 to form the heat dissipating structure 20 as illustrated in FIG. 3.

Figure 4:
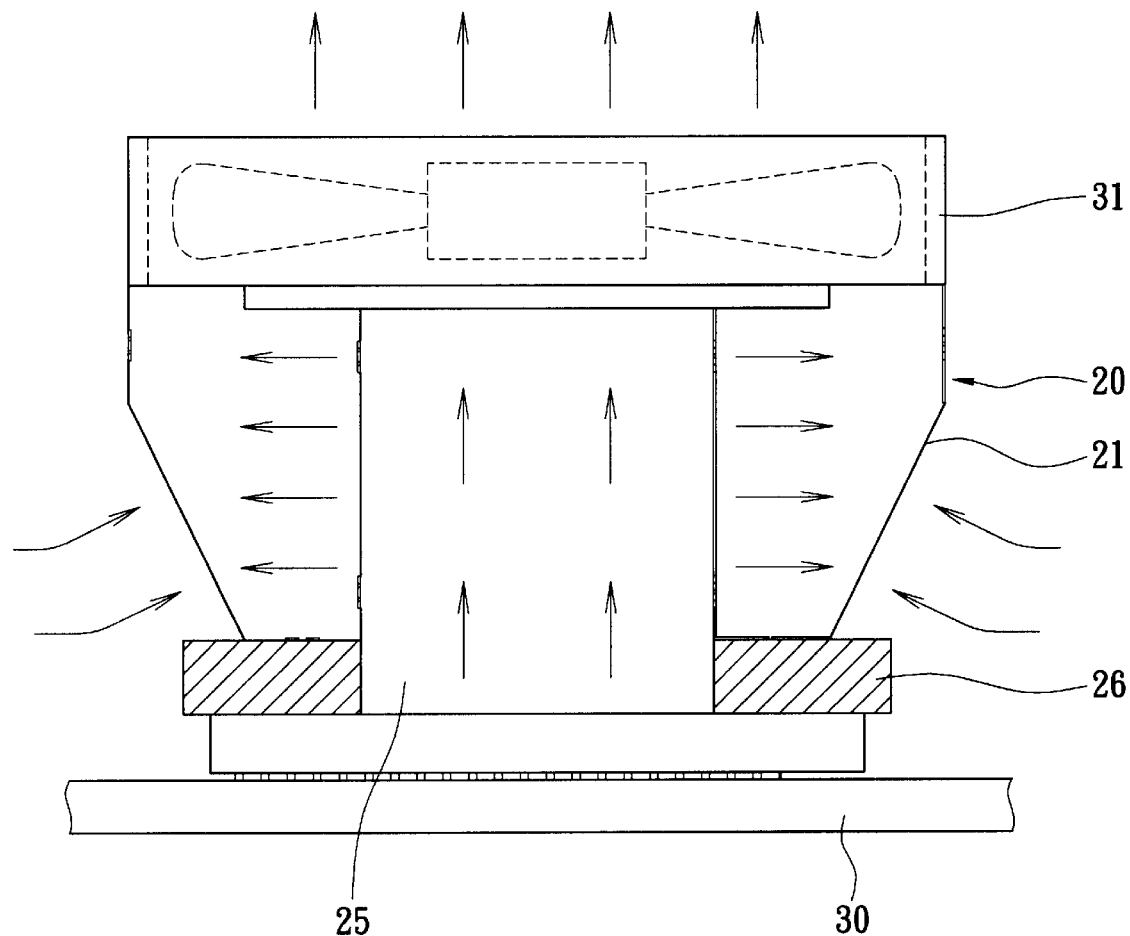
Figure 5:
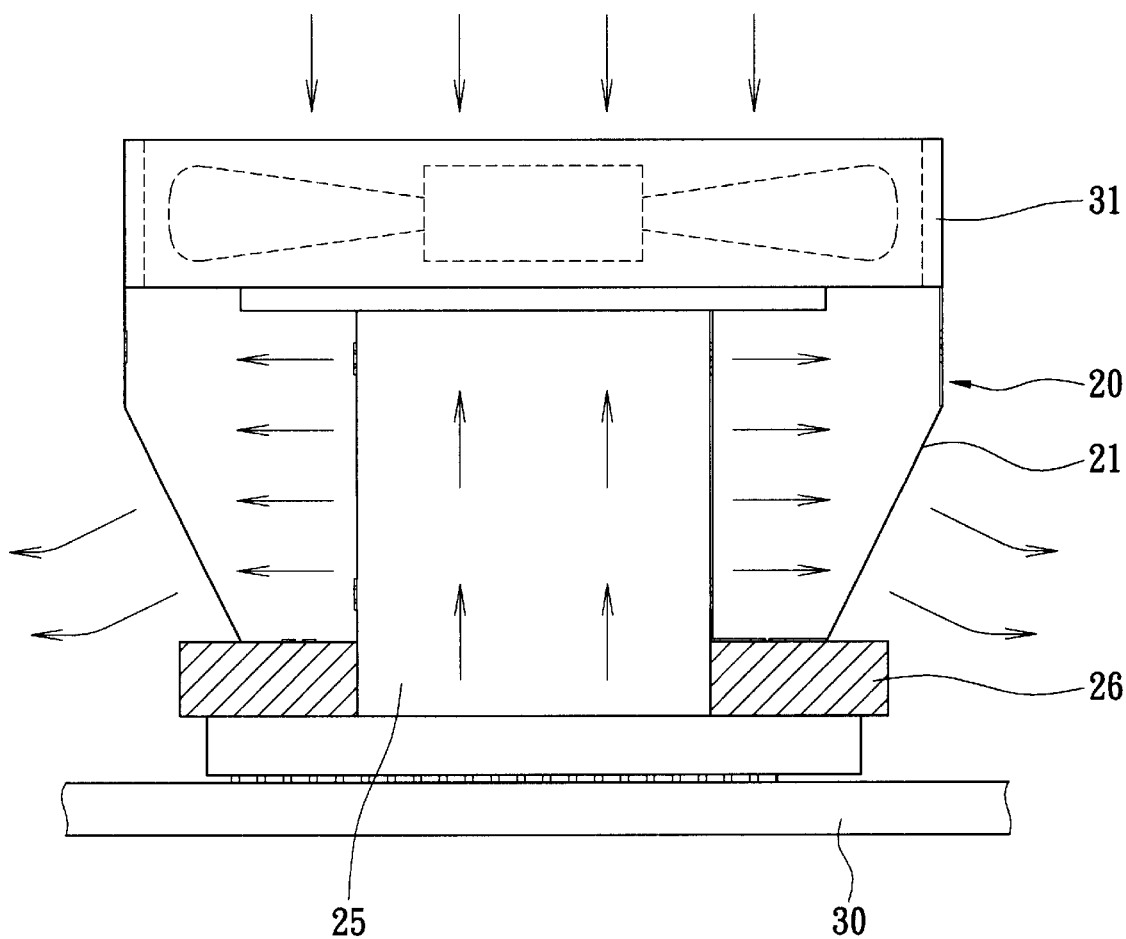

Below the first folded edge 211, each assembled fin 21 further forms an inclined edge 22 that is spaced away from one another via a gap 23. As illustrated in FIG. 4 and FIG. 5, the heat irradiated from a heat source 30 (such as a central processor unit), with the help of a fan 31 that promotes the air circulation, is thereby rapidly dissipated through the gaps 23 out of the electronic appliance. The heat dissipating is therefore improved, which prevents hothouse effects.

The heat dissipating structure 20, constituted by the assembly of the fins 21 according to a closed contour configuration, defines a central cylindrical hole 24 in which is mounted a highly thermal conductive body 25, for example, a copper tube. The second folded edge 221 increases the contact area between each fin 21 and the body 25. The third folded edge 231 of each fin 21 and the body 25 may be further attached to a heat dissipating base 26 via various methods such as soldering, hard welding, ultrasonic or resistive welding, or bonding through a thermally conductive adhesive to promote the heat dissipation.

As described above, the heat dissipating structure of the invention therefore includes at least the following advantages.

(1) The hothouse effects are prevented.

(2) The air circulation is promoted to improve the heat dissipation performance.

(3) The heat dissipating structure can be easily adapted to different configurations, which can therefore satisfy different constraint requirements.

Those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A heat dissipating structure, comprising a plurality of metallic fins assembled with one another, an upper side and an inner side of each metallic fin respectively forming a first and second folded edge, each metallic fin further forming an inclined edge below the first folded edge, thereby a plurality of gaps are formed between the respective inclined edges of the metallic fins being adjacently assembled with one another.

2. The structure of claim 1, wherein the second folded edges of the metallic fins further contact with a highly thermal conductive body.

3. The structure of claim 2, wherein the highly thermal conductive body is a copper tube.

4. The structure of claim 1, wherein a lower side of each metallic fin further forms a third folded edge.

5. The structure of claim 4, wherein the third folded edge of each metallic fin is attached to a heat dissipating base via soldering, hard welding, ultrasonic welding, resistive welding, or bonding through a thermally conductive adhesive.

6. The structure of claim 1, wherein the metallic fins are made of aluminum or copper.

7. The structure of claim 1, wherein each of the first, second, and third folded edges of the metallic fins, at a central region, includes a groove through one rim and a hooking projection on an opposite rim, so that the metallic fins thereby assemble with one another by engagement of the hooking projection of one metallic fin with the corresponding groove of an adjacent metallic fin.

* * * * *